United States Patent [19]

Takai

[11] Patent Number: 5,550,784
[45] Date of Patent: Aug. 27, 1996

[54] SEMICONDUCTOR MEMORY DEVICE WITH SYNCHRONOUS DRAM WHOSE SPEED GRADE IS NOT LIMITED

[75] Inventor: Yasuhiro Takai, Tokyo, Japan

[73] Assignee: NEC Corporation, Tokyo, Japan

[21] Appl. No.: 534,270

[22] Filed: Sep. 26, 1995

[30] Foreign Application Priority Data

Sep. 28, 1994 [JP] Japan ................................. 6-232730

[51] Int. Cl.$^6$ ........................................... G11C 8/00
[52] U.S. Cl. ...................................... 365/233; 365/236
[58] Field of Search ................................. 365/233, 236, 365/194, 230.06, 230.08

[56] References Cited

U.S. PATENT DOCUMENTS

| 5,430,680 | 7/1995 | Parris | 365/236 |
| 5,454,097 | 9/1995 | Babin | 365/236 |

OTHER PUBLICATIONS

NEC Technical Reports, vol. 47, No. 3, 1994, pp. 76–77.

*Primary Examiner*—A. Zarabian
*Attorney, Agent, or Firm*—Sughrue, Mion, Zinn, Macpeak & Seas

[57] ABSTRACT

The semiconductor memory device disclosed includes a burst counter in a first stage of pipeline, a column switch latch portion in a second stage of the pipeline and an output data latch circuit in a third stage. In the operation mode with CAS latency of 2, as a control signal of the burst counter, a clock signal is outputted and, as a control signal of the column switch latch portion, a logical sum OR fixed to a high level by a mode signal is outputted. The device further includes a delay circuit and an output controller. The data output circuit is arranged such that it supplies, as a control signal of the output data latch circuit, a logical product AND of the inversion of the mode signal and the clock signal, and a logical sum OR of a signal delayed through the delay circuit and a logical product AND of the mode signal. In the synchronous DRAM thus configured, the speed grade in the operation mode with CAS latency of 2 is not restricted.

3 Claims, 5 Drawing Sheets

SEMICONDUCTOR MEMORY DEVICE WITH SYNCHRONOUS DRAM WHOSE SPEED GRADE IS NOT LIMITED

BACKGROUND OF THE INVENTION (1) Field of the Invention

This invention relates to semiconductor memory devices, and more particularly to semiconductor memory devices, in which the speed grade of synchronous DRAM, synchronous SRAM, etc. synchronized to an external clock is improved when the Column Address Strobe (CAS) latency is 2.

(2) Description of the Related Art

Figure 1A:
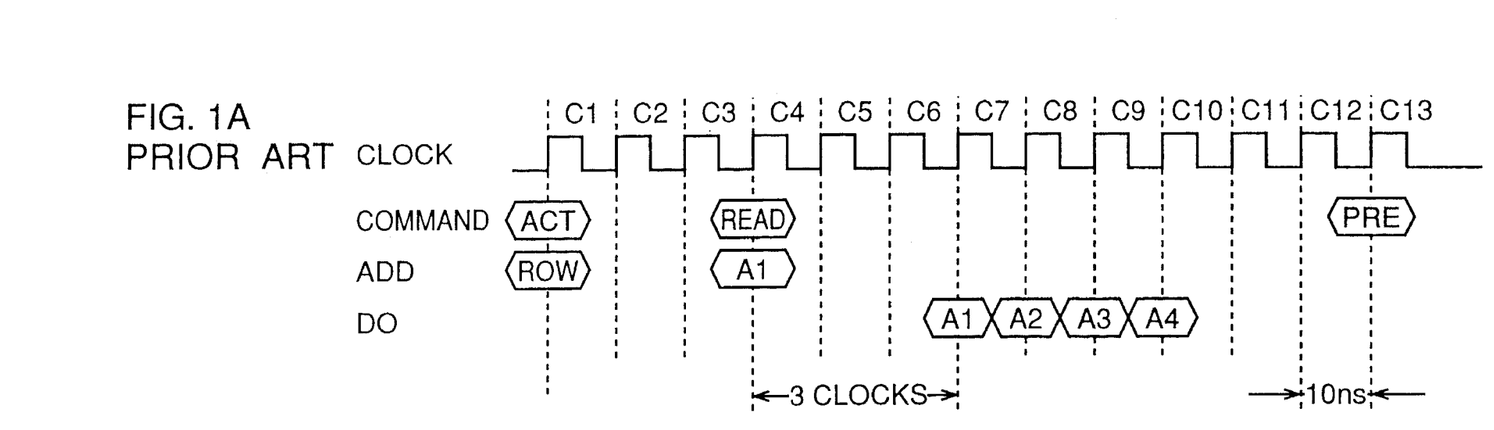
FIG. 1A is a timing chart for describing the operation of a prior art synchronous DRAM when the CAS latency is 3.
Figure 1B:
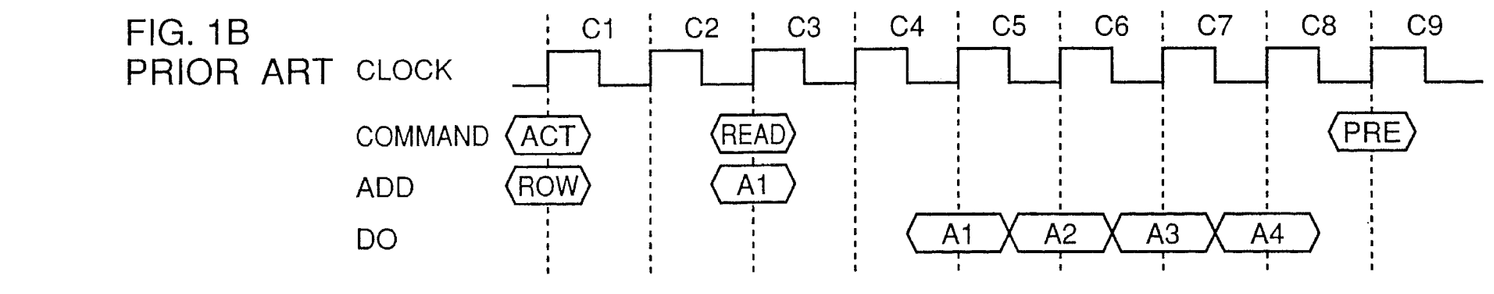
FIG. 1B is a timing chart for describing the operation of the prior art synchronous DRAM when the CAS latency is 2.
Figure 1C:
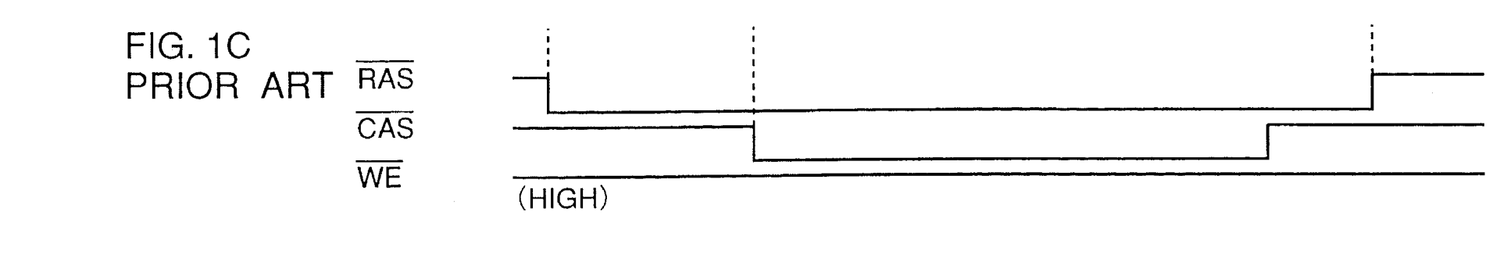
FIG. 1C is a timing chart corresponding to those in FIGS. 1A and 1B for describing the operation of a prior art general purpose DRAM.

Some prior art semiconductor devices of this type are shown in "NEC Technical Reports", Vol. 47, No. 3, 1994, pp. 76–77. FIGS. 1A and 1B are timing charts of operation of the synchronous DRAM in the literature, FIG. 1A being for the case when the CAS latency is 3, and FIG. 1B being for the case when the CAS latency is 2. FIG. 1C is a timing chart of operation of a general purpose DRAM corresponding to the timing charts in FIGS. 1A and 1B. Referring to FIGS. 1A to 1C, external signals, for instance, a command signal (COMMAND) and an external address signal (ADD) are latched in synchronism to the rise timing of a clock signal from low level to high level, the latched signals being decoded to be recognized as respective commands.

The term "CAS latency" herein refers to the necessary number of clock cycles from the designation of column address (READ command input) till the outputting of the designated address data. For example, referring to FIG. 1A, in clock cycle C6 that is delayed two clock cycles after clock cycle C4 of clock signal for synchronizing the READ command input, data of internal address signal A1 turns to be outputted as the first output data, and a memory system latches and outputs this data at the rise timing of clock cycle C7 delayed three clock cycles, thus providing CAS latency of 3. In subsequent clock cycles C8 to C10, data of internal addresses A2 to A4 generated in an internal counter, i.e., a burst counter, are outputted.

In the case of FIG. 1B, in clock cycle C5 two clock cycles delayed after clock cycle C3 of the clock signal for synchronizing the READ command, data of address A1 is outputted to provide CAS latency of 2.

The fact that in the synchronous DRAM a row address signal (ROW) and an active command (ACT) are supplied in synchronism to clock cycle C1 of the clock signal, corresponds in the general purpose DRAM to Row Address Strobe (RAS) inversion signal in clock cycle C1 from high level to low level, and a word line for taking out the low address signal is selected, thereby amplifying the memory cell data in a sense amplifier.

The supplying of the external address signal A1 and the READ command in synchronism to clock cycle C1 corresponds in the general purpose DRAM to the supplying of the external address signal A1 and the inverting of the CAS inversion signal from high level to low level in clock cycle C4, and data of address A1 is read out as shown in FIG. 1C.

The supplying of a precharge command (PRE) in synchronism to clock cycle C13 corresponds, in the general purpose DRAM, to the inverting of the RAS inversion signal from low level to high level in clock cycle C13.

The speed grade which represents the typical operation speed of the current general purpose DRAM is –60. In this grade, time from the external address signal input till the output of data stored in a memory cell from an output buffer, i.e., address access time, is 30 nsec. In the case of the synchronous DRAM, on the other hand, the internal operation from the supply of the READ command till the output of the memory cell data from the output buffer, corresponds to the operation in the address access time of the general purpose DRAM.

Thus, when the CAS latency is 3, an internal operation for 30 nsec. is performed in three clock cycles. This means that the minimum clock cycle period of 10 nsec., and the maximum frequency is 100 MHz.

Considering, for instance, a case when it is desired to operate the synchronous DRAM with a minimum clock cycle of 15 nsec., i.e., at a relatively low frequency of 67 MHz, it corresponds to 45 nsec. in three clocks. As described before, inside the synchronous DRAM, as for the operation speed power the minimum clock cycle is 10 nsec., and three clocks corresponds to 30 nsec. Therefore, the longer time of 45 nsec. is outside the subject of consideration.

Therefore, when an operation mode is set such that data of internal address signal A1 begins to be outputted from the next clock (i.e., first clock) to the clock signal at the timing when the READ command is supplied, that is, when a mode is set to CAS latency of 2, the minimum clock cycle becomes 15 nsec. with two clocks becoming 30 nsec. The maximum frequency is thus 67 MHz. It is thus possible to increase the system effect.

When a 100 MHz operation with CAS latency of 3 and a 67 MHz operation with CAS latency of 2 are considered as internal operations in the device, they are substantially at the same internal operation speed.

In other words, when the CAS latency is 3, the three clock cycles correspond to 3×10=30 nsec., while with CAS latency of two clock cycles correspond to 2×15=30 nsec.

Figure 2:
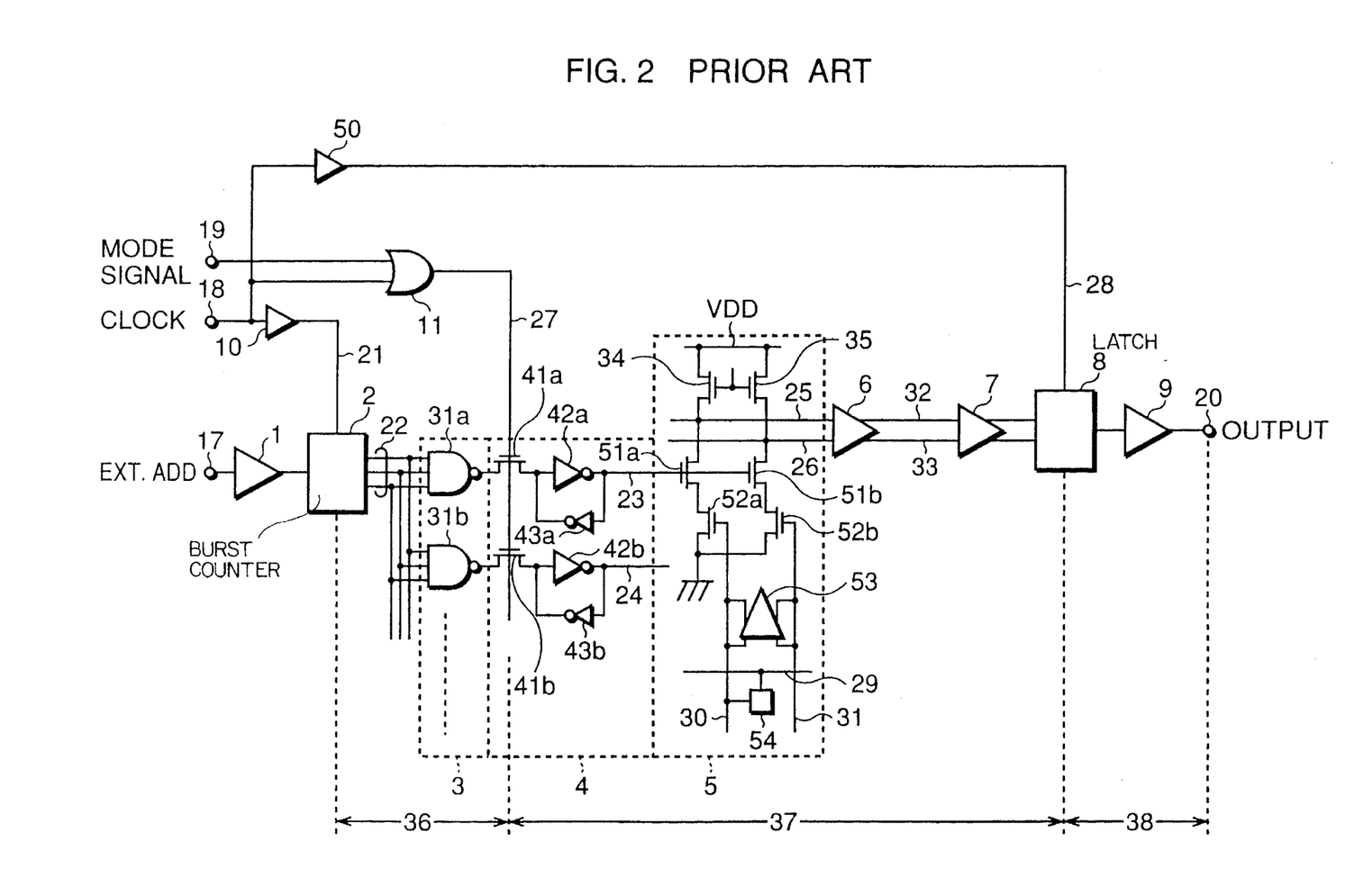
FIG. 2 is a schematic representation of a prior art semiconductor memory device.

FIG. 2 is schematic representation of a prior art example of semiconductor memory device. This memory device adopts a three-stage pipeline system, in which the flow of signal from the supply of an external address signal till the memory data output from the output buffer, i.e., the address access bus, is divided by three latch circuits.

This semiconductor memory device comprises an input buffer 1 for receiving an external address signal supplied from an input terminal 17; a burst counter 2 for latching the external address signal output in synchronism to a clock signal supplied from a terminal 18 through buffer 10, thus generating internal addresses A1, A2, A3, . . . , a column decoder 3 including NAND gates 31a, 31b, . . . , for decoding the data output of the burst counter 2; a column switch latch portion 4 including a plurality of latch elements each having a switch 41a and inverters 42a and 43a, for latching the column decoder output in synchronism to a control signal which is outputted from an OR gate 11 for taking logical sum (OR operation) of the clock signal and an internally supplied mode signal 19; a memory block 5; a column selector constituting the memory block 5 and including a series circuit having a transistor 51a with a column selection signal 23 coupled thereto and a transistor 52a with one sense amplifier output coupled thereto at the gate, and another series circuit having a transistor 51b with the column selection signal coupled thereto and a transistor 52b with the other sense amplifier output coupled thereto at the gate, these series circuits being connected between a power supply potential VDD and the ground potential; a sense amplifier 53 for amplifying cell data supplied from pair digit lines 30 and 31; a cell 54 provided at an intersection of a word line 29 crossing the digit lines 30 and 31; read buses 25 and 26 for transferring cell data, which are pulled up by load elements 34 and 35, respectively, to the power supply potential VDD; data amplifiers 6 and 7 for amplifying the cell data on the read buses 25 and 26; an output data latch circuit 8 for latching the cell data supplied on the read/write buses 32 and 33 in synchronism to a clock signal supplied from the clock signal terminal 18 through the buffer 50; and an output buffer 9 for outputting the output data through an output terminal 20 to the outside.

The column decoder 3, column switch latch portion 4 and memory clock 5 are shown only partly for facilitating the description.

In the illustration of the above structure, a portion from the burst counter 2 to the column switch latch portion 4 is shown as a first stage 36 of pipeline, a portion from the column switch latch portion 4 to the output data latch circuit 8 is shown as a second stage 37 of pipeline, and a portion from the output data latch circuit 8 to the output terminal 20 is shown as a third stage 38 of pipeline.

Figure 3A:
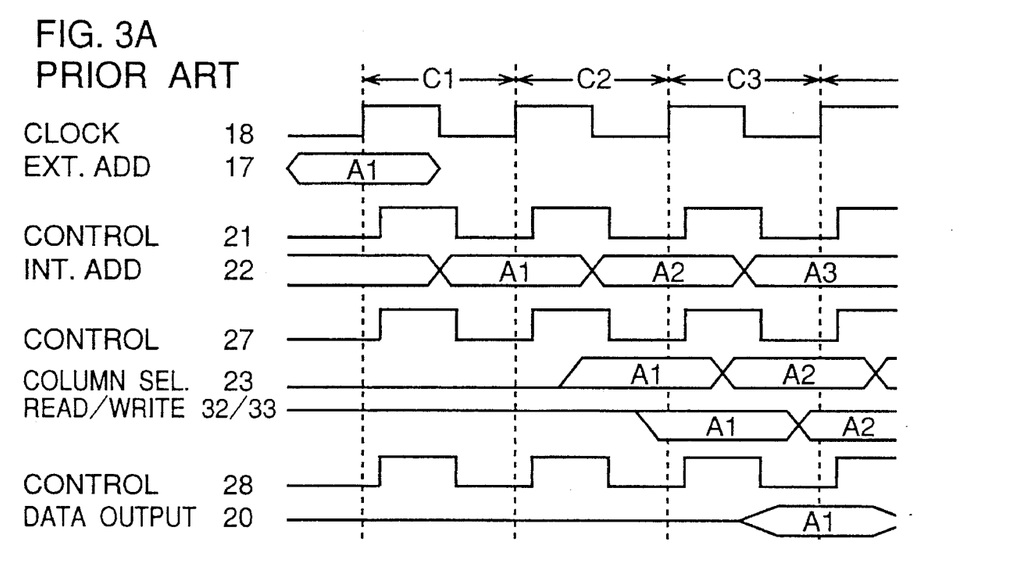
FIG. 3A is a timing chart for describing the operation of a prior art example when the CAS latency is 3.
Figure 3B:
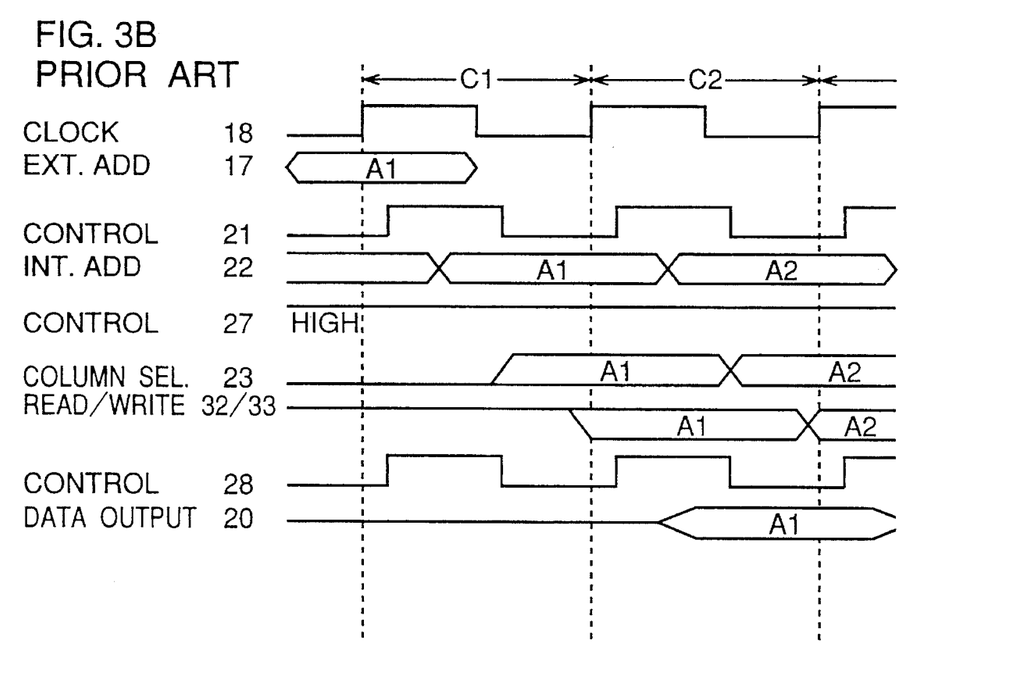
FIG. 3B is a timing chart for describing the operation of the prior art example when the CAS latency is 2.

FIGS. 3A and 3B are timing charts for describing the operation of the above FIG. 2 structure, FIG. 3A being for a case when the CAS latency is 3, and FIG. 5B being for a case when the CAS latency is 2.

In the first stage 36 of pipeline, in clock cycle C1 of the clock signal, the burst counter 2 latches external address signal A1, and generates and outputs internal address signals A1, A2, A3, ... which are decoded in the column decoder 3.

In the case when the CAS latency is 3, with the mode signal 19 in low level, in the second stage 37 of pipeline in the next clock cycle C2, the output of the column decoder 3 is latched in synchronism to the clock signal on the control signal line 27, and by this latched output signal which is at high level, the transistors 51a and 51b of the memory block 5 are selected.

At this time, the word line 29 that is selected by an active command and a row address (ROW) (both being not shown) allows memory cell data to be read out onto the pair digit lines 30 and 31. The data thus read out is amplified in the sense amplifier 53 to render one of the pair digit lines 30 and 31 to be at high level and the other at low level. By this high level, for instance, the transistor 2a is activated and then the transistors 51a and 51b are activated. The read bus 25 to which the activated transistor 51a is connected becomes low level. The read bus 26 to which the non-activated transistor 51b is connected becomes high level because it is pulled up to the power source potential VDD by the load element 34. These data are amplified by the data amplifiers 6 and 7 so as to be supplied to the output latch circuit 8.

Then, in the third stage 38 of pipeline, in the next clock cycle C3, the output latch circuit 8 latches data supplied in synchronism to the clock signal on the control signal line 28, and outputs the latched data to the outside through the output buffer 9.

In the case when the CAS latency is 2, the operation in completed in two clock cycles as mentioned above. To this end, the mode signal 19 becomes high level to forcibly fix the output of the OR gate 11 to high level, and the second stage of pipeline is not latched but is brought to a state in which data is outputted by inversion only. That is, the first and second stages of pipeline are coupled together and operated in one clock cycle, thereby realizing the CAS latency of 2.

In the above semiconductor memory device, the signal processing times or capacities of the first stage, the second stage and the third stage of pipeline are about 7, 10 and 10 nsec., respectively. Thus, when the CAS latency is 3, the minimum clock cycle that is necessary for obtaining the operation of all the pipeline stages is 10 nsec., that is, the corresponding maximum frequency is 100 MHz.

When the CAS latency is 2, the first and second stages of pipeline are coupled together for one clock cycle operation. Thus, in this case the minimum clock cycle necessary for the operation of all the pipeline stages is 7+10=17 nsec., and the corresponding maximum frequency is 59 MHz.

As described before, when the speed grade representing the typical operation speed of the current general purpose DRAM is −60, the time from the inputting of the external address signal till the outputting of data stored in the memory cell from the output buffer, i.e., the address access time, is 30 nsec. On the other hand, the internal operation of the synchronous DRAM from the supplying of the READ command till the outputting of the memory cell data from the output buffer, corresponds to the operation of the general purpose DRAM in the address access time thereof.

Therefore, in comparison to the case when it is desired to operate the synchronous DRAM in the same minimum clock cycle of 15 nsec. as in the general purpose DRAM, i.e., at the corresponding relatively low frequency of 67 MHz, when the CAS latency is 2, the minimum clock cycle is 7 nsec., and the maximum frequency is 59 MHz. The operation speed is therefore extremely reduced with the same speed grade.

In other words, the CAS latency of 2 determines the upper limit of the speed grade, resulting in an operation speed deterioration as great as about 15%, and therefore it is impossible to attain the desired speed grade.

SUMMARY OF THE INVENTION

An object of the present invention, which has been intended in view of the above drawbacks inherent in the prior art, is to provide a synchronous DRAM, which can improve the operation speed upper limit in a case when the CAS latency is 2.

According to one aspect of the invention, there is provided a semiconductor memory device which includes a burst counter for latching an external address signal and generating an internal address signal in synchronism to a first clock signal having a predetermined cycle period; a column decoder for decoding the internal address signal; a column switch latch portion which assumes a data-through state with the supply of the first clock signal being cutoff when a mode signal internally supplied is active, and latches the output of the column decoder in synchronism to the first clock signal when the mode signal is inactive; and an output data latch circuit for reading out memory data designated by the output of the column switch latch portion under control of a read command and latching the read-out data in synchronism to the first clock signal, and in which, when the mode signal is inactive, a first operation mode is set to read out the data designated by the internal address signal in synchronism to the first clock signal that is N (N being an integer not less than 2) clock cycles after the latch timing of the burst counter, and the read-out data is outputted from the output data latch circuit, and when a second clock signal having a longer cycle period than the first clock signal is supplied in lieu of the first clock signal and also when the mode signal is inactive, a second operation mode is set to read out the data designated by the internal address signal in synchronism to the second clock signal N−1 clock cycles after the latch timing of the burst counter, and the readout data is outputted from the output data latch circuit, the semiconductor memory device comprising:

a delay circuit for delaying the second clock signal by a predetermined period of time under the second operation mode; and an output control means for controlling the data to be outputted from the output data latch circuit in synchronism to the second clock signal that is delayed by the delay circuit.

The semiconductor memory device according to the invention can be set to a first operation mode, in which in response to a first clock signal, an external address signal is latched to generate internal address signal for reading memory data designated by the internal address signal under control of a read command and outputting the read-out data from an output data latch in synchronism to the first clock signal N (N being 2 or a greater integer) clocks after the latch timing of the first clock signal, and also to a second operation mode, in which in response to the second clock signal of a longer cycle than the first clock signal, in lieu of the first clock signal, the external address signal is latched to generate the internal address signal for reading out memory data designated by the internal address signal under control of a read command and outputting the read-out data from the output data latch in response to the second clock signal after N−1 clocks from the latch timing of the external address signal, the device further having means for delaying the second clock signal by a predetermined period of time in the second operation mode, the output data latch outputting data in response to the delayed signal. Thus, it is possible to execute the second operation mode without possibility of restriction on the upper limit of the operation speed grade of a synchronous DRAM or a synchronous SRAM.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENT OF THE INVENTION

An embodiment of the invention will now be described with reference to the drawings.

Figure 4:
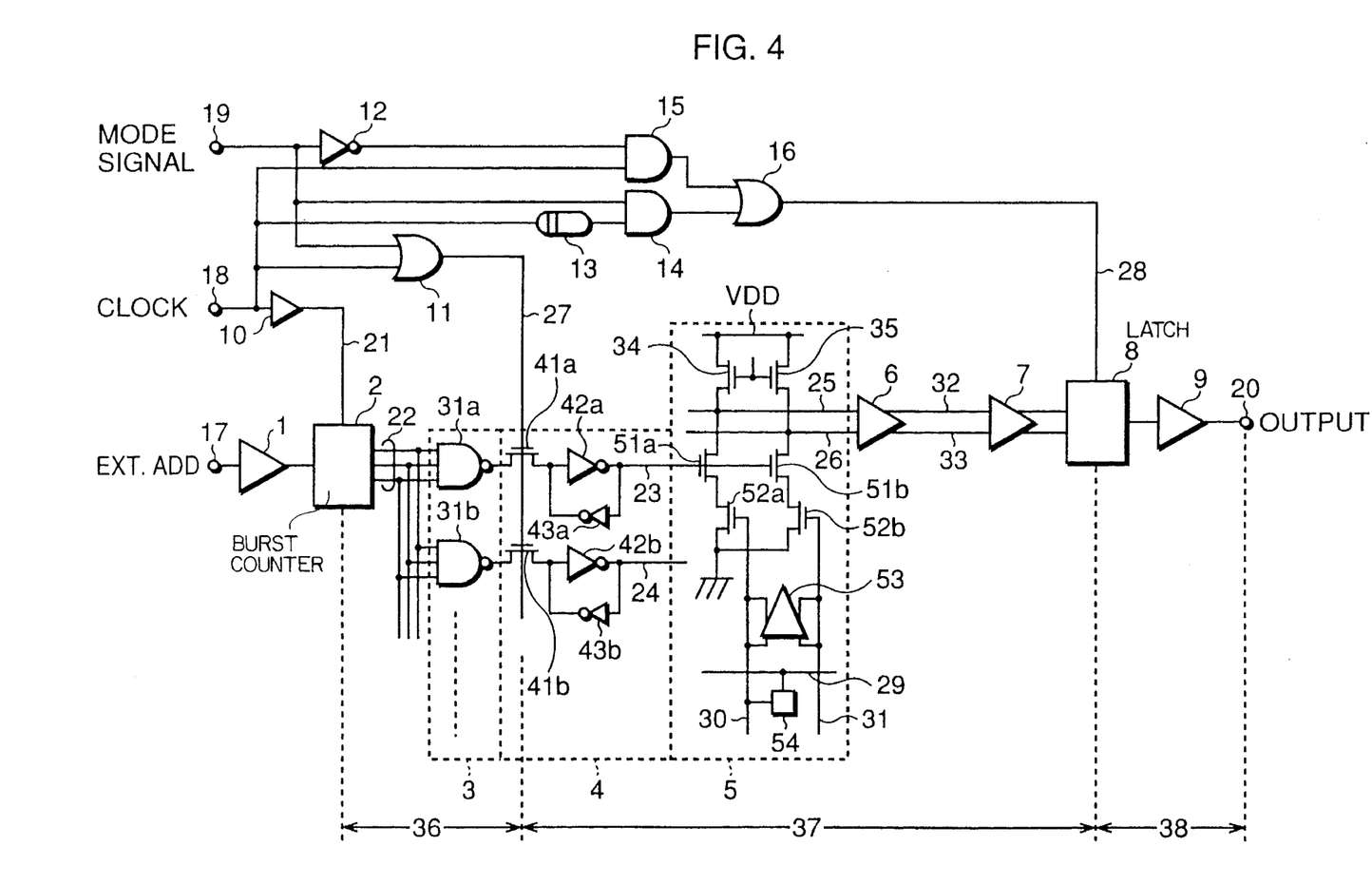
FIG. 4 is a schematic representation of an embodiment of the invention.

FIG. 4 is a schematic representation of an embodiment of the semiconductor memory device according to the invention. This embodiment is different from the prior art example described above in that, when the CAS latency is 2, the output data latch control signal supply timing is delayed by a delay circuit to provide the same speed grade as in the case of the general purpose DRAM.

Referring to FIG. 4, in this semiconductor memory device, an external address signal input terminal 17 is connected to an input buffer 1, which has its output terminal connected to a data input terminal of a burst counter 2. To a control signal input terminal of the burst counter 2 is connected a control line 21, to which a clock signal is supplied from an input terminal 18 through a buffer 10. A data output terminal of the burst counter 2 is connected via an internal address signal line 22 to input terminals of NAND gates 31a and 31b of a column decoder 3. Output terminals of the column decoder 3 are connected to a data input terminal of a switch 41a of a column switch latch portion 4. To a control signal input terminal of the column switch latch portion 4 is connected via a control signal line 27 the output of an OR gate 11 for taking logical sum of an internally supplied mode signal 19 and the clock signal supplied from the terminal 18.

The column switch latch portion 4 includes a predetermined number of latch circuits each of which has a switch 41a having a control signal input terminal, an inverter 42a, the switch 41a and inverter 42a being cascade connected between the data input terminal and a data output terminal, and an inverter 43a in parallel with and in the inverse polarity to the inverter 42a. An output terminal of the column switch latch portion 4 is connected via a column selection signal line 23 to the gates of transistors 51a and 51b of a memory block 5.

The memory block 5 includes transistors 51a and 52a connected in series between a read bus 25 and ground potential and transistors 51b and 52b connected in series between a read bus 26 and ground potential. A sense amplifier 53 has a pair of output terminals that are connected to the gates of the respective transistors 52a and 52b. A pair of input terminals of the sense amplifier 53 are connected to a pair of digit lines 30 and 31. A cell 54 is disposed at an intersection of word line 29 crossing the pair of digit lines 30 and 31.

The read buses 25 and 26 are pulled up by respective load elements 34 and 35 to the power supply voltage VDD and connected to a data amplifier 6. An output terminal of the data amplifier 6 is connected via read/write buses 32 and 33 to a data input terminal of a data amplifier 7, which has its output line connected to a data input terminal of an output data latch circuit 8.

To a control signal input terminal of the output data latch circuit 8 is connected an output terminal of an OR gate 16 for taking logical sum of the output of an AND gate 14, which has an input terminal connected through a delay circuit 13 to the clock signal input terminal 19 and the other input terminal connected to a mode signal input terminal, and the output of an AND gate 15, which has an input terminal connected to the clock signal input terminal 18 and the other input terminal connected through an inverter 12 to a signal line of mode signal 19.

The output data latch circuit 8 has an output line connected through a buffer 9 to a data output terminal 20.

The column decoder 3, column switch latch portion 4 and memory block 5 are shown only partly for facilitating the description.

In the illustration of the above structure, a portion from the burst counter 2 to the column switch latch portion 4 is shown as a first stage 36 of pipeline, a portion from the column switch latch portion 4 to the output data latch circuit 8 is shown as a second stage 37 of pipeline, and a portion from the output data latch circuit 8 to the output terminal 20 is shown as a third stage 38 of pipeline.

Figure 5A:
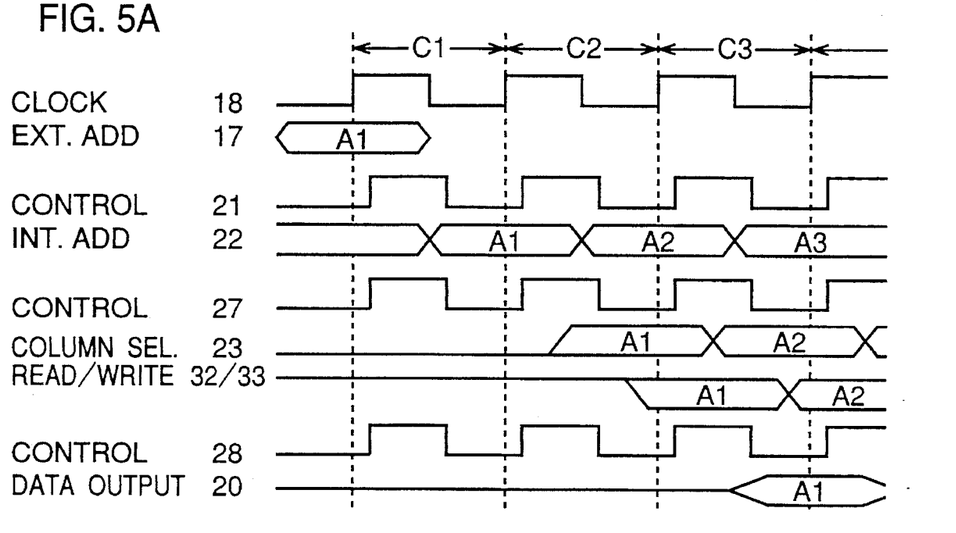
FIG. 5A is a timing chart for describing operation when the CAS latency is 3.
Figure 5B:
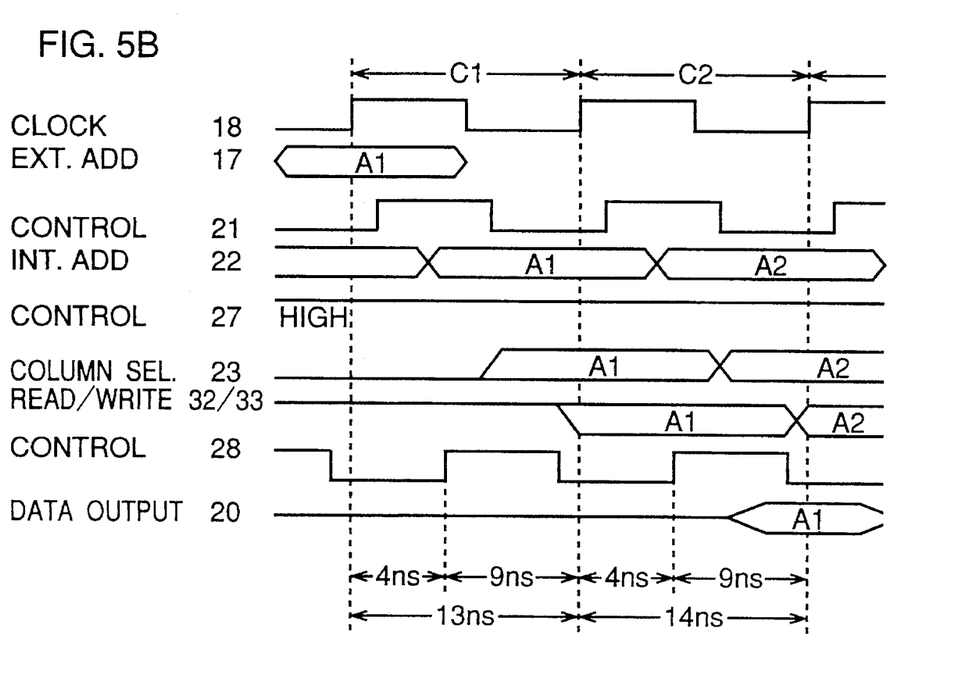
FIG. 5B is a timing chart for describing operation when the CAS latency is 2.

FIGS. 5A and 5B are timing charts for describing the operation of the above FIG. 4 structure, FIG. 5A being for a case when the CAS latency is 3, and FIG. 5B being a case when the CAS latency is 2.

In the first stage 36 of pipeline, in clock cycle C1 of the clock signal, the burst counter 2 latches external address signal A1, and generates and outputs internal address signals A1, A2, A3, . . . , these address signals being decoded in a column decoder 3 and then supplied to the column switch latch portion 4.

When the CAS latency is 3, with the mode signal set to low level, the OR gate 11 outputs the supplied clock signal directly to a control signal line 27. Thus, in the second stage 37 of pipeline, in the next clock cycle C2, the column switch latch portion 4 latches the output of the column decoder 3 in synchronism to the clock signal, and by this latched output signal which is at a high level, the transistors 51a and 51b of the memory block 5 are selected.

At this time, data in the memory cell 54 is read out via a word line 29 which is selected according to an active command and a row address (ROW) (both being not shown) to the pair digit lines 30 and 31. This read-out memory cell data is amplified by the sense amplifier 53 to render one of the pair of digit lines 30 and 31 to high level and the other to low level. With the high level, the transistor 52a, for instance, is activated, and then the transistors 51a and 51b are activated by column selection signal 23 outputted from the column switch latch portion 4, and thus the read bus 25 with the transistor 51a connected thereto becomes low level.

On the other hand, the transistor 52b connected to the bit line 31 of low level is not activated, and thus the read bus 26 with the transistor 51b connected thereto becomes high level since the read bus has been pulled up by the load element 35 to the power supply potential VDD.

The cell data read out to the read buses 25 and 26 are amplified by the data amplifiers 6 and 7, and then supplied to the output latch circuit 8.

Then, in the third stage 38 of pipeline, since, in the next clock cycle C3, the mode signal 19 is at low level, the high level output of the inverter 12 is supplied to one input terminal of the AND gate 15, and thus the clock signal supplied to the other input terminal is directly outputted to one input terminal of the OR gate 16. Since the mode signal 19 is at low level, the output of the AND gate 14 is fixed to low level and, thus, the OR gate 16 transfers the clock signal to the control signal line 28. In synchronism to the clock signal, the output latch circuit 8 latches the supplied cell data and begins to output data through the output buffer 9 and data output terminal 20 to the outside.

When the CAS latency is 2, in the first stage 36 of pipeline, the same operation as in the case when the CAS latency is 3 is performed until the internal address signals A1, A2, A3, . . . which are generated from the burst counter 2 as a result of latching of the external address signal A1 in the clock cycle C1 of the clock signal are decoded in the column decoder 3 and supplied to the column switch latch portion 4.

When the CAS latency is 2, as described before, the operation is completed in two clock cycles. By changing the mode signal 19 to high level, the output of the OR gate 11 is forcibly changed to high level, and with this high level, the control signal input terminal of the column switch latch portion 4 is fixed to high level, thus bringing about a state of only inversely outputting data without latch operation of the second stage of pipeline.

In other words, the first and second stages of pipeline are coupled together for one clock cycle operation thereof, whereby, when the CAS latency is 2, the first and second stages of pipeline are operated in clock cycle C1, and thus up to the end timing of the clock cycle C1, the transistors 51a and 51b are selected to specify memory cell, data therein being thus amplified in the sense amplifier 53, and the amplified data is outputted to the read buses 25 and 26. The data is further amplified in the data amplifiers 6 and 7 and then supplied to the output data latch circuit 8.

Meanwhile, in the output data latch circuit 8 in the third stage of pipeline, since the mode signal 19 is at high level, the inverter provides a low level output to one input terminal of the AND gate 15. Since this signal is not influenced by the clock signal supplied to the other input terminal, the output of the AND gate 15 is fixed to low level so that the input to one input terminal of the OR gate 16 is fixed in level. The output of the AND gate 14 is supplied to the other input terminal of the OR gate 16. At this time, one input terminal of the AND gate 14 is fixed to high level of the mode signal 19, while clock signal which has been delayed in the delay circuit 13 by a predetermined delay time, for instance a design delay time of 4 nsec., is supplied to the other input terminal, this clock signal delayed by 4 nsec. being supplied directly to the output terminal of the AND gate 14.

The OR gate 16 transfers the delayed clock signal mentioned above to the control signal line 28. In the timing of the next clock cycle C2, the output latch circuit 8 latches the supplied cell data in synchronism to the delayed clock signal, and begins to output the latched data through the output buffer 9 and the data output terminal 20 to the outside.

In the case of the CAS latency of 2, the delay time of 4 nsec. as mentioned above means that the clock signal is designed such that the virtual operation speed is 13 and 14 nsec. in the first and second cycles, respectively. In other words, the operation speed capacity of the synchronous DRAM is, as mentioned above, 7, 10 and 10 nsec. in the first to third stages of pipeline, respectively, so that the sum of the clock cycles C1 and C2 of the clock signal 18 in FIG. 5B is 27 nsec. Where the first and second stages are directly coupled together, the clock cycle is 17 nsec. However, since the clock signal supplied to the control signal input terminal of the output data latch circuit 8 has been delayed by 4 nsec., the time period from the rise timing of the clock cycle C1 of the clock signal supplied to the control signal input terminal of the burst counter 2 from low level to high level to the rise timing of the clock cycle C2 of the clock signal 28 supplied to the control signal input terminal of the output data latch circuit 8, can be regarded to be 17 nsec.–4 nsec.=13 nsec.

Meanwhile, in the third stage the time period from the rise timing of the clock cycle C2 of the clock signal supplied to the control signal input terminal of the burst counter 2 from low level to high level to the rise timing of the clock cycle C3 of the clock signal supplied to the control signal input terminal of the output data latch circuit 8, can be regarded to be 10 nsec.+4 nsec.=14 nsec.

Thus, the maximum frequency is 71 MHz, and no restriction is imposed on the upper limit of the speed grade that may otherwise result from setting the CAS latency to 2, so that it is possible to achieve a speed grade of –10.

While the above embodiment has been described in connection with the case of the CAS latency being of 3 and 2, the same results are obtainable to attain speed grade improvement in the case where the CAS latency can be set to N (N being 2 or greater integer) and N−1.

Further, while the synchronous DRAM using a three-stage pipeline system has been described, since the subject of the invention is the data output timing, the invention is applicable as well to, for instance, a synchronous DRAM of a two-bit pre-fetch system.

Further, the invention is applicable not only to the synchronous DRAM but also to a semiconductor memory device operable in synchronism to a clock, for instance a synchronous SRAM.

While the invention has been described in its preferred embodiments, it is to be understood that the words which have been used are words of description rather than limitation and that changes within the purview of the appended claims may be made without departing from the true scope of the invention as defined by the claims.

What is claimed is:

1. A semiconductor memory device which includes a burst counter for latching an external address signal and generating an internal address signal in synchronism to a first clock signal having a predetermined cycle period; a column decoder for decoding the internal address signal; a column switch latch portion which assumes a data-through state with the supply of the first clock signal being cut-off when a mode signal internally supplied is active, and latches the output of the column decoder in synchronism to the first clock signal when the mode signal is inactive; and an output data latch circuit for reading out memory data designated by the output of the column switch latch portion under control of a read command and latching the read-out data in synchronism to the first clock signal, and in which, when the mode signal is inactive, a first operation mode is set to read out the data designated by the internal address signal in synchronism to the first clock signal that is N (N being an integer not less than 2) clock cycles after a latch timing of the burst counter, and the read-out data is outputted from the output data latch circuit, and when a second clock signal having a longer cycle period than the first clock signal is supplied in lieu of the first clock signal and also when the mode signal is inactive, a second operation mode is set to read out the data designated by the internal address signal in synchronism to the second clock signal N−1 clock cycles after the latch timing of the burst counter, and the readout data is outputted from the output data latch circuit, said semiconductor memory device comprising:

a delay circuit for delaying said second clock signal by a predetermined period of time under said second operation mode; and an output control means for controlling the data to be outputted from said output data latch circuit in synchronism to said second clock signal that is delayed by said delay circuit.

2. The semiconductor memory device according to claim 1, in which said output control means is arranged such that it supplies, as a control signal of said output data latch circuit, a logical product AND of the inversion of said mode signal and the second clock signal, and a logical sum OR of a signal obtained as a result of delaying said second clock signal through said delay circuit and a logical product AND of said mode signal.

3. The semiconductor memory device according to claim 2, in which said delay circuit is arranged such that the time of delay determined thereby does not exceed a time determined as the difference between the cycle of said first clock signal and the cycle of said second clock signal.

* * * * *